United States Patent [19]

Kimmel et al.

[11] Patent Number: 4,651,302

[45] Date of Patent: Mar. 17, 1987

[54] READ ONLY MEMORY INCLUDING AN ISOLATION NETWORK CONNECTED BETWEEN THE ARRAY OF MEMORY CELLS AND THE OUTPUT SENSE AMPLIFIER WHEREBY READING SPEED IS ENHANCED

[75] Inventors: Richard D. Kimmel, Wappingers Falls; Ronald W. Knepper, Lagrangeville, both of N.Y.; Richard Levi, Coral Springs, Fla.

[73] Assignee: International Business Machines Corporation, Armonk, N.Y.

[21] Appl. No.: 674,213

[22] Filed: Nov. 23, 1984

[51] Int. Cl.[4] ............................................ G11C 17/00
[52] U.S. Cl. .................................. 365/104; 365/189; 307/530
[58] Field of Search ................. 365/104, 189, 103, 94, 365/174; 307/530

[56] References Cited

U.S. PATENT DOCUMENTS

| | | | |
|---|---|---|---|
| 3,617,772 | 11/1971 | Tertel | 365/155 |
| 3,678,475 | 7/1972 | Jordan et al. | 365/104 |
| 3,735,358 | 5/1973 | Ho | 365/104 |
| 3,745,539 | 5/1973 | Davidson | 365/177 |
| 4,031,522 | 6/1977 | Reed et al. | 365/186 |
| 4,031,524 | 6/1977 | Heeren | 365/104 |
| 4,037,218 | 7/1977 | Groeger et al. | 365/104 |
| 4,048,626 | 9/1977 | Fett | 365/104 |
| 4,070,654 | 1/1978 | Tachi | 365/104 |
| 4,122,545 | 10/1978 | Lodi | 365/186 |
| 4,215,282 | 7/1980 | Brown | 307/364 |

OTHER PUBLICATIONS

Montegari et al, "Current Biased Array Sense Circuit", IBM Tech. Discl. Bull., vol. 24, No. 1B, Jun. 1981, pp. 493-494.
Bellis et al, "High Speed Sense Amplifier and Dual Phase Output Circuit", IBM Technical Disclosure Bulletin, vol. 26, No. 7B, Dec. 1983, pp. 3651-3652.
Denis et al, "Quasi-Insensitive Memory Sense Amplifier to Dotting and Wiring Capacitance", IBM Tech. Disc. Bull., vol. 24, No. 6, Nov. 1981, pp. 3060-3061.
"Monolithic Read-Only Storage Circuit", by J. L. Cross, IBM Technical Disclosure Bulletin, vol. 13, No. 9, Feb. 1971, pp. 2770-2771.

Primary Examiner—James W. Moffitt
Assistant Examiner—Glenn A. Gossage
Attorney, Agent, or Firm—Wesley DeBruin

[57] ABSTRACT

A read only memory utilizing a two-level cascoded current steering approach feeding a two-level common base isolation and sense amplifier network. The isolation network allows formation of a multi-way collector dot without deleterious effect upon the high speed current sensing operation. Single transistor cells with a common subcollector bed and common base rails as word lines make up the highly dense high speed array. The current source is provided by a current mirror circuit. The common-base, low impedance sense amplifier converts the sense current signal into a voltage swing which is then fed to the off-chip driver circuit via an emitter-follower pre-driver stage.

1 Claim, 2 Drawing Figures

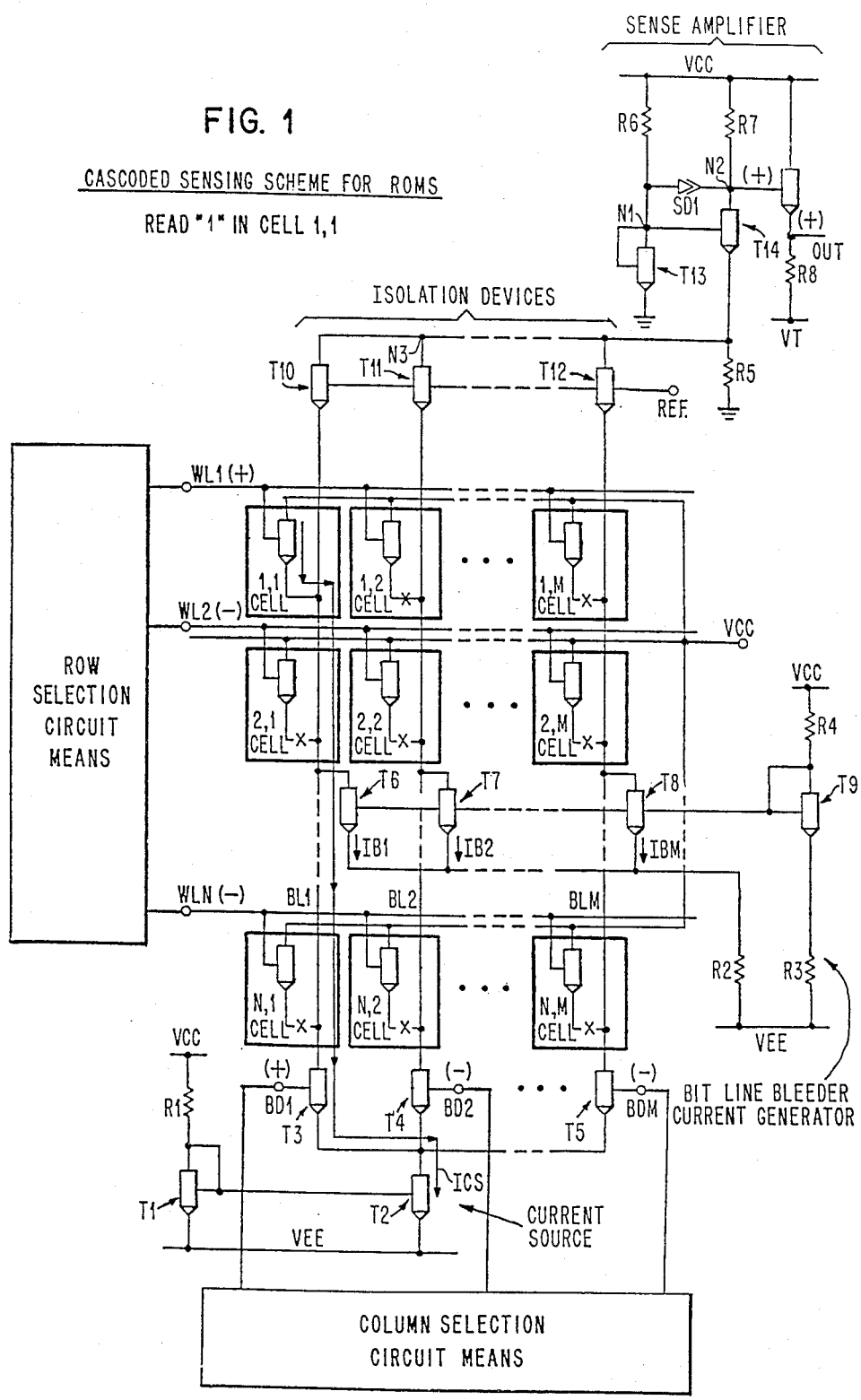

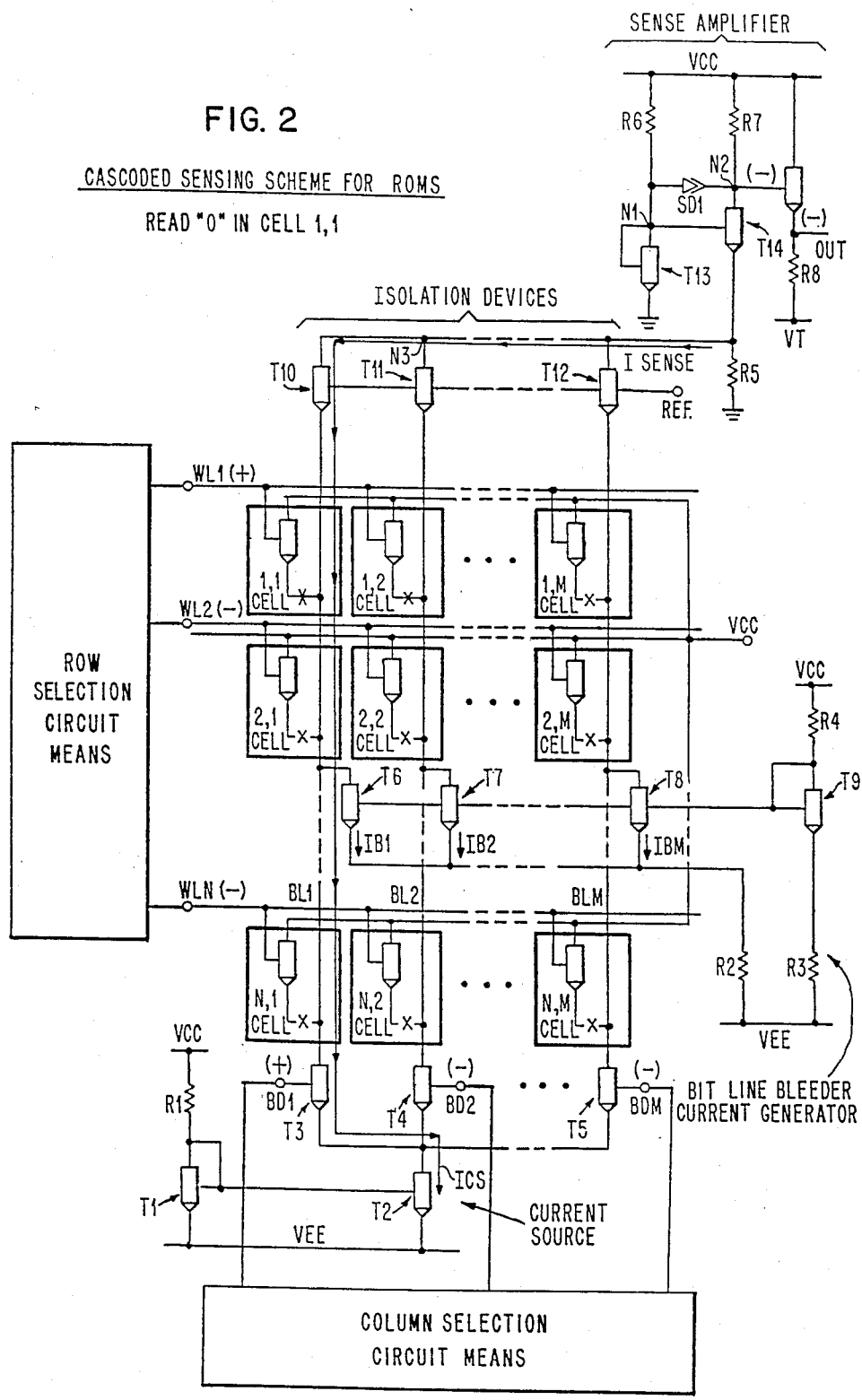

READ ONLY MEMORY INCLUDING AN ISOLATION NETWORK CONNECTED BETWEEN THE ARRAY OF MEMORY CELLS AND THE OUTPUT SENSE AMPLIFIER WHEREBY READING SPEED IS ENHANCED

FIELD OF THE INVENTION

The invention is directed to an improved read-only memory.

BACKGROUND OF THE INVENTION AND PRIOR ART

There are numerous circuits and structures known to the prior art as read-only memories. One such read-only memory may be generally described as follows:

The memory employs an array of storage cells having m columns and n rows. Each storage cell includes a transistor having a collector, base and emitter. The m×n array of transistors have a common collector and are formed in a single isolation region. During manufacture of the array each emitter of a transistor is either connected, or not, to its appropriate emitter rail according to a particular desired binary bit pattern. Information is then determined during the read out of the storage device by sensing whether or not current flows through a particular device at the intersection of two selected base and emitter rails.

The following U.S. Patents and publications are set-forth as representative of the prior art. It is to be appreciated that the art identified below is not all of the prior art or necessarily the best prior art.

PATENTS

U.S. Pat. No. 3,617,772 entitled "Sense Amplifier/Bit Driver For A Memory Cell" granted Nov. 2, 1971, to K. G. Tertel.

U.S. Pat. No. 3,735,358 entitled "Specialized Array Logic" granted May 22, 1973 to I. T. Ho.

U.S. Pat. No. 3,745,539 entitled "Latch Type Regenerative Circuit For Reading A Dynamic Memory Cell" granted July 10, 1973 to E. D. Davidson et al.

U.S. Pat. No. 4,031,522 entitled "Ultra High Sensitivity Sense Amplifier For Memories Employing Single Transistor Cells" granted June 21, 1977 to J. A. Reed at al.

U.S. Pat. No. 4,031,524 entitled "Read-Only Memories, and Readout Circuits Therefor" granted June 21, 1977 to R. H. Heeren.

U.S. Pat. No. 4,037,218 entitled "Read Only Memory Module" granted July 19, 1977 to I. Groeger et al.

U.S. Pat. No. 4,048,626 entitled "Memory Device" granted Sept. 13, 1977 to D. L. Fett.

U.S. Pat. No. 4,070,654 entitled "Bipolar Read-Only Memory" granted Jan. 24, 1978 to S. Tachi.

U.S. Pat. No. 4,122,545 entitled "Memory Array Of Inversion Controlled Switches" granted Oct. 24, 1978 to R. J. Lodi.

U.S. Pat. No. 4,215,282 entitled "Temperature Compensated Sense Amplifier For Proms And the Like" granted July 29, 1980 to G. W. Brown et al.

PUBLICATIONS

IBM Technical Disclosure Bulletin (IBM TDB), "Monolithic Read-Only Storage Circuit" by J. L. Cross, IBM TDB Vol. 13, No. 9, February 1971, pages 2770-1.

SUMMARY OF THE INVENTION

The primary object of the invention is to provide an improved read-only memory.

A further object of the invention is an improved high speed read only memory.

A still further object of the invention is to provide a ready only memory including isolation circuit means and improved sensing means to enhance the speed at which the memory may be read.

The read only memory in accordance with the invention utilizes a two-level cascoded current steering approach feeding a two-level common base isolation and sense amplifier network. The isolation network allows formation of a multi-way collector dot without deleterious effect upon the high speed current sensing operation. Single transistor cells with a common subcollector bed and common base rails as word lines make up the highly dense, high speed array. The current source is provided by a current mirror circuit. The common-base, low impedance sense amp converts the sense current signal into a voltage swing which is then fed to the off-chip driver circuit via an emitter-follower pre-driver stage.

Other objects, advantages and features of the invention will be apparent from the following detailed description of specific examples and embodiment, when taken in conjunction with the appended drawings of the preferred embodiment.

BRIEF DESCRIPTION OF THE DRAWING

FIG. 1 discloses a read only memory, in accordance with the invention, wherein a binary "1" is stored in cell 1,1 of the m×n array of memory cells.

FIG. 2 discloses a read only memory, in accordance with the invention, wherein a binary "0" is stored in cell 1,1 of the m×n array of memory cells.

DESCRIPTION OF THE PREFERRED EMBODIMENT

The cascoded sensing scheme for ROMS, in accordance with the invention provides high speed sensing capability in a highly dense bipolar read-only memory chip (ROM).

The circuitry utilizes a two-level cascoded current steering approach feeding a two-level common base isolation and sense amplifier network. The isolation network allows formation of a 32-way collector dot without deleterious effect upon the high speed current sensing operation. Single transistor cells with a common subcollector bed and common base rails as word lines make up the highly dense, high speed array. The current source is provided by a current mirror circuit. The common-base low impedance sense amplifier converts the sense current signal into a voltage swing which is then fed to the off-chip driver circuit via an emitter-follower pre-driver stage.

FIGS. 1 and 2 show the circuit schematic for the present invention under conditions of reading a "1" and reading a "∅", respectively. In FIG. 1 cell 1,1 has been selected by raising word line WL1 to an up level while holding word lines WL2 ... WLN at their down level voltage. At the same time bit select transistor T3 has been turned-on with a positive-going signal at node BD1 (while transistors T4 ... T5 remain off due to down levels at their respective base terminals) causing current $I_{CS}$ to be steered through T3, into bit line BL1, and through cell 1,1. $I_{CS}$ is generated at the bottom of the cascode tree by a current mirror comprised of devices T1 and T2 with resistor R1. Since cell 1,1, contains a "1", i.e. a physical connection exists between bit line BL1 and the emitter of the cell 1,1, current $I_{CS}$ is steered through cell 1,1 and into the common array subcollector bed connected to the $V_{CC}$ supply. (The up level of word line WL1 is, of course, higher in potential than the reference voltage at the base of the isolation transistors T10, T11, . . . T12.)

Since current $I_{CS}$ has been steered through cell 1,1, no sense current flows through isolation transistor T10 and through the sense amplifier transistor T14, thus causing the sense amp node N2 to charge to an up level via resistor R7. Therefore, the output is at an up level, as indicated in FIG. 1.

Refer now to FIG. 2 for the description of a read "∅" operation. In this case cell 1,1 is selected, as in FIG. 1, causing the select current $I_{CS}$ to be steered through bit select transistor T3 and unto bit line BL1. However, since cell 1,1 contains a "∅", no physical connection from line BL1 to the emitter of cell 1,1 exists, and thus, current $I_{CS}$ is steered through isolation device T10 and into node N3. (Node N3 is comprised of a fairly large capacitance due to the collector dot of transistor T10 . . . T12.) The voltage on node N3 drops slightly, turning on T14 and causing $I_{CS}$ to flow through T14 and resistor R7 to the most positive supply $V_{CC}$. (Actually, positive current flows in the opposite direction from that described, i.e. from $V_{CC}$ to $V_{EE}$). The voltage on node N2 therefore, drops to a down level and causes the output to be pulled to a down level by resistor R8.

The sensing of a "1", or a "∅" is a high speed operation, particularly since devices T10 . . . T12 isolate the high capacitance of the collector dot on node N3 from the sense node N2, thus allowing R7 to charge node N2 rapidly (for a "1") and $I_{CS}$ to discharge N2 rapidly via T14 (for a "∅"). Resistor R6 and transistor T13 act as a low impedance voltage source, maintaining node N1 at one $V_{BE}$ above ground. Resistor R5 bleeds current through T14 at all times, thus maintaining T14 in its linear conductive state, so as to provide a high speed sensing operation. Schottky diode SD1 prevents T14 from saturating when sensing a "∅".

Transistors T6, T7 . . . T8, and T9 along with resistors R2, R3, and R4 comprise a bit line bleeder current generator for the purpose of bleeding a small current from each bit line at all times. These small bleeder currents keep each unselected bit line from floating to a more positive potential, which would then impact (lengthen) access time upon selection of such a bit line. The bleeder currents maintain each unselected bit line at a potential of one $V_{BE}$ below either the isolation network reference voltage (V REF) or the selected word line voltage, depending upon whether each cell on the selected word line contains a "∅" or a "1", respectively.

The layout of the array is constructed with P+ diffused base rails in parallel with and shorted periodically to first metal wires as the word lines. Second metal wires form the bit lines with the personalization accomplished by the presence or absence of a connecting via between the first level emitter metal and the second level metal bit line for any given cell. The collectors of each array cell form one large subcollector bed. The layout allows both high density and high performance due to the single device compact cells and the metal lines on both first and second metal, thus eliminating any series resistance delay penalties on the word or bit lines.

While a preferred embodiment and examples of the invention have been described in detail above, it will be obvious that various modifications may be made from the specific details described, without departing from the spirit and scope of the invention.

What is claimed is:

1. In a read only memory, said read only memory including:

a plurality of memory cells arranged in an array having n rows and m columns, each of said memory cells storing a binary bit ("1" or "0") of data, each of said memory cells consisting essentially of a transistor having a collector, base and emitter, n word lines, each of said n word lines connected to the base of said m transistors of said m memory cells in a discrete one of said n rows of memory cells, each of said n word lines having a first end and a second end;

m bit lines, each of said m bit lines being associated with n memory cells in a discrete one of said m columns of memory cells, at least one, or more, of said m bit lines being connected to one, or more, of the emitters of the transistors of said n associated memory cells of said one, or more, bit lines, each of said m bit lines have a first end and a second end;

bit line bleeder current generator circuit means connected to said m bit lines, said bit line bleeder current generator circuit means including a first group of m transistors and an m+1 transistor, each of said first group of m transistors and said m+1 transistor having a collector, base and emitter, each of said m collectors of said first group of m transistors being connected to a discrete one of said m bit lines, each of said m emitters of said first group of m transistors being connected in common via a first resistor to a first source of potential, a common connection between each of said bases of said first group of m transistors and said base of said m+1 transistor, a common connection between said base and said collector of said m+1 transistor, a second resistor connected between said emitter of said m+1 transistor and said first source of potential, a third resistor connected between said collector of said m+1 transistor and a second source of potential;

word line selection means connected to said first ends of said n word lines, said second ends of said n word lines connected in common to said second source of potential;

a second group of m transistors, said second group of m transistors each having a collector, base and emitter, each of said m collectors of said second group of m transistors being connected to the second end of a discrete one of said m bit lines, a common connection between said m emitters of said second group of m transistors;

current source means connected to said common connection of said m emitters of said second group of m transistors;

bit line selection means, said bit line selection means connected to said m bases of said second group of m transistors;

sense amplifier circuit means for sensing the binary bit ("1" or "0") stored in a predetermined one of said memory cells being read, where said predetermined one of said memory cells is selected by said word line selection means and said bit line selection means, said sense amplifier circuit means including first, second and third transistors, each of said first, second and third transistors having a collector, base and emitter, a fourth resistor connected between said collector of said first transistor and said second source of potential, said base of said first transistor, said collector of said first transistor and said base of said second transistor connected in common, said emitter of said first transistor connected to a third source of potential, a fifth resistor connected between said collector of said second transistor and said second source of potential, a sixth resistor connected between said emitter of said second transistor and said third source of potential, said collector of said third transistor connected to said second source of potential, a seventh resistor connected between said emitter of said third transistor and a fourth source of potential, said sense amplifier circuit means having an input terminal connected to said emitter of said second transistor and an output terminal connected to said emitter of said third transistor, a sense amplifier output signal appearing at said output terminal of sense amplifier circuit means; and said read only memory being further characterized by the inclusion of isolation circuit means interconnecting said sense amplifier circuit means and said array of memory cells, said isolation circuit means including a third group of m transistors, said third group of m transistors each having a collector, base and emitter, each of said m emitters of said third group of m transistors being connected to the first end of a discrete one of said m bit lines, a common connection between each of the bases of said third group of m transistors and a source of reference potential, and a common connection between said input terminal of said sense amplifier circuit means and said m collectors of said third group of m transistors, said isolation circuit means reducing the capacitive impedance load on said sense amplifier circuit means whereby read time of a read operation is materially reduced and and output signal from said sense amplifier circuit means is enhanced.

* * * * *